US012622269B2

(12) United States Patent
Terasaki

(10) Patent No.: US 12,622,269 B2
(45) Date of Patent: May 5, 2026

(54) COPPER/CERAMIC BONDED BODY AND INSULATING CIRCUIT SUBSTRATE

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 228 days.

(21) Appl. No.: 18/291,265

(22) PCT Filed: Jul. 29, 2022

(86) PCT No.: PCT/JP2022/029320
§ 371 (c)(1),
(2) Date: Jan. 23, 2024

(87) PCT Pub. No.: WO2023/008565
PCT Pub. Date: Feb. 2, 2023

(65) Prior Publication Data
US 2024/0363481 A1 Oct. 31, 2024

(30) Foreign Application Priority Data

Jul. 30, 2021 (JP) .................................. 2021-125532

(51) Int. Cl.
*H01L 23/12* (2006.01)
*H01L 23/373* (2006.01)
(Continued)

(52) U.S. Cl.
CPC .......... *H01L 23/3735* (2013.01); *H01L 23/15* (2013.01); *H01L 23/49822* (2013.01); *H01L 24/32* (2013.01)

(58) Field of Classification Search
CPC ..... H01L 23/12; H01L 23/13; H01L 23/3735; H05K 1/09; H05K 3/022; H05K 3/38;
(Continued)

(56) References Cited

U.S. PATENT DOCUMENTS

2016/0221305 A1 8/2016 Terasaki et al.
2019/0135706 A1 5/2019 Terasaki
(Continued)

FOREIGN PATENT DOCUMENTS

CN 108040435 A 5/2018
CN 119403775 A 2/2025
(Continued)

OTHER PUBLICATIONS

International Search Report mailed Sep. 6, 2022, issued fo PCT/JP2022/029320 and English translation thereof.
(Continued)

*Primary Examiner* — Timothy J Thompson
*Assistant Examiner* — Aditya Sharma
(74) *Attorney, Agent, or Firm* — Troutman Pepper Locke LLP

(57) ABSTRACT

The copper/ceramic bonded body according to the present invention is a copper/ceramic bonded body obtained by bonding copper members consisting of copper or a copper alloy to a ceramic member, where in an edge region E of each of the copper members, an area ratio of each of Ag solid solution parts having an Ag concentration of 0.5% by mass or more and 15% by mass or less is set in a range of 0.03 or more and 0.35 or less.

6 Claims, 4 Drawing Sheets

(51) Int. Cl.

| | | |
|---|---|---|
| *H01L 23/00* | (2006.01) | |
| *H01L 23/15* | (2006.01) | |
| *H01L 23/498* | (2006.01) | |

(58) Field of Classification Search

CPC ... H05K 1/0306; C04B 37/026; B23K 35/007

See application file for complete search history.

(56) References Cited

U.S. PATENT DOCUMENTS

| | | |
|---|---|---|
| 2019/0150298 A1 | 5/2019 | Kishimoto |
| 2021/0176860 A1 | 6/2021 | Tsugawa et al. |

FOREIGN PATENT DOCUMENTS

| | | |
|---|---|---|
| JP | 3211856 B2 | 9/2001 |
| JP | 2002-274964 A | 9/2002 |
| JP | 2003-055058 A | 2/2003 |
| JP | 2014-090144 A | 5/2014 |
| JP | 2015-092552 A | 5/2015 |
| JP | 5757359 B2 | 7/2015 |
| JP | 2015-185705 A | 10/2015 |
| JP | 5957862 B2 | 7/2016 |
| JP | 2018-008869 A | 1/2018 |
| JP | 2021-098641 A | 7/2021 |
| WO | 2013/024813 A1 | 2/2013 |
| WO | 2017/213207 A1 | 12/2017 |
| WO | 2018/221493 A1 | 12/2018 |

OTHER PUBLICATIONS

Yin Na et al., "Preparation and Performance of Ag/La2NiO4 Composite Contact Materials," Rare Metal Materials and Engineering, Issue Jun. 6, 28, 2006, pp. 990-993 and English abstract thereof (cited in the Mar. 9, 2026 Notice of Allowance issued for CN202280051515.7).

Li Zhiqiang et al., "Brazing technology for piezoelectric ceramics and copper stator elastomers in ultrasonic motors," Transactions of the China Welding Institution, Issue 09, vol. 36, No. 9, Sep. 2015, 2 pages (cited in the Mar. 9, 2026 Notice of Allowance issued for CN202280051515.7).

Bao Lumin, "Research on low-silver brazing filler metal and welding mechanism for alumina ceramic brazing," China Master's Thesis Full-text Database, Engineering Science and Technology I, Issue 5. Dec. 2021, 35 pages including English abstract (cited in the Mar. 9, 2026 Notice of Allowance issued for CN202280051515.7).

Notice of Allowance mailed Mar. 9, 2026, issued for CN202280051515.7 and English translation thereof.

FIG. 3

COPPER/CERAMIC BONDED BODY AND INSULATING CIRCUIT SUBSTRATE

TECHNICAL FIELD

The present invention relates to a copper/ceramic bonded body obtained by bonding a copper member consisting of copper or a copper alloy to a ceramic member, and an insulating circuit substrate including a ceramic substrate and a copper sheet consisting of copper or a copper alloy, which is bonded to a surface of the ceramic substrate.

Priority is claimed on Japanese Patent Application No. 2021-125532, filed Jul. 30, 2021, the content of which is incorporated herein by reference.

BACKGROUND ART

A power module, an LED module, and a thermoelectric module have a structure in which a power semiconductor element, an LED element, and a thermoelectric element are bonded to an insulating circuit substrate in which a circuit layer consisting of a conductive material is formed on one surface of an insulating layer.

For example, a power semiconductor element for high power control, which is used for controlling wind power generation, an electric vehicle, a hybrid vehicle, or the like, generates a large amount of heat during operation, and thus, an insulating circuit substrate including a ceramic substrate, a circuit layer formed by bonding a metal plate having excellent electrical conductivity to one surface of the ceramic substrate, and a metal layer for heat radiation, which is formed by bonding a metal plate to the other surface of the ceramic substrate has been widely used in the related art as a substrate on which the power semiconductor element is mounted.

For example, Patent Document 1 proposes an insulating circuit substrate in which a circuit layer and a metal layer are formed by bonding a copper sheet to one surface and the other surface of a ceramic substrate. In Patent Document 1, the copper sheet is disposed on one surface of the ceramic substrate and the other surface thereof with an Ag—Cu—Ti-based brazing material being interposed, and then a heating treatment is carried out to bond the copper sheet (so-called active metal brazing method).

In addition, Patent Document 2 proposes a power module substrate in which a copper sheet consisting of copper or a copper alloy is bonded to a ceramic substrate consisting of AlN or $Al_2O_3$ by using a bonding material containing Ag and Ti.

Further, Patent Document 3 proposes a power module substrate in which an aluminum sheet consisting of aluminum or an aluminum alloy is bonded to a ceramic substrate by using a brazing material consisting of an alloy such as an Al—Si-based, Al—Ge-based, Al—Cu-based, Al—Mg-based, or Al—Mn-based alloy. In addition, according to Patent Document 3, an overhang part is formed in the periphery of each of a circuit layer formed on one surface of the ceramic substrate and a heat radiation layer formed on the other surface of the ceramic substrate. As a result, insulating properties between the circuit layer and the heat radiation layer are ensured, and concurrently, the heat capacity in the circuit layer and the heat radiation layer is increased.

CITATION LIST

Patent Documents

[Patent Document 1]
Japanese Patent No. 3211856
[Patent Document 2]
Japanese Patent No. 5757359
[Patent Document 3]
Japanese Patent No. 5957862

SUMMARY OF INVENTION

Technical Problem

By the way, in recent years, there is a tendency that a heat generation temperature of a semiconductor element mounted on an insulating circuit substrate increases, and an insulating circuit substrate is required to have a thermal cycle reliability that can withstand a thermal cycle more severe than a thermal cycle in the related art.

Here, in an insulating circuit substrate obtained by bonding a copper sheet to a ceramic substrate, in a case where an overhang part is formed on the circuit layer as described in Patent Document 3, there is a risk that thermal stress is concentrated on the edge of the circuit layer, and the bonding reliability is decreased in a case where a thermal cycle is loaded.

In addition, in the edge of the copper member, Ag contained in the bonding material undergoes solid solution to be subject to solid solution and hardening. In a case where the edge of the copper member is hardened by the solid solution hardening, there is also a risk that thermal stress is concentrated on the edge of the circuit layer, and the bonding reliability is decreased.

The present invention has been made in consideration of the above-described circumstances, and an objective of the present invention is to provide a copper/ceramic bonded body having an excellent thermal cycle reliability, which can suppress the occurrence of breaking in a ceramic member even in a case where a severe thermal cycle is loaded, and an insulating circuit substrate consisting of the copper/ceramic bonded body.

Solution to Problem

In order to solve the above-described problem, the copper/ceramic bonded body according to one aspect of the present invention is characterized by being a copper/ceramic bonded body obtained by bonding a copper member consisting of copper or a copper alloy to a ceramic member, in which in an edge region of the copper member, an area ratio of an Ag solid solution part having an Ag concentration of 0.5% by mass or more and 15% by mass or less is set in a range of 0.03 or more and 0.35 or less.

It is noted thin the edge region of the copper member in the present invention is a region having a width of 100 μm from the edge of the copper member to the central side of the copper member, and a height in a range from the bonding surface of the ceramic member to a surface of the copper member on a side opposite to the ceramic member, in a cross section of the copper/ceramic bonded body along the laminating direction.

According to the copper/ceramic bonded body according to one aspect of the present invention, since an area ratio of an Ag solid solution part having an Ag concentration of 0.5% by mass or more and 15% by mass or less is set to 0.03 or more in an edge region of the copper member, Ag is sufficiently reacted at a bonding boundary between the copper member and the ceramic member even in the edge of the copper member, which makes it possible to firmly bond the ceramic member to the copper member.

In addition, since the area ratio of the Ag solid solution part is set to 0.35 or less, the unnecessary hardening of the edge region of the copper member by the solid solution hardening is suppressed, which makes it possible to suppress the breaking or peeling of the ceramic member in a case where a thermal cycle is loaded.

Here, in the copper/ceramic bonded body according to one aspect of the present invention, it is preferable that at a bonded interface between the ceramic member and the copper member, an active metal compound layer is formed on a side of the ceramic member, and a thickness t1 of the active metal compound layer is set in a range of 0.05 μm or more and 0.8 μm or less.

In this case, since an active metal compound layer is formed on a side of the ceramic member, and a thickness t1 of the active metal compound layer is set in a range of 0.05 μm or more and 0.8 μm or less, the active metal reliably and firmly bonds the ceramic member and the copper member, and concurrently, the hardening of the bonded interface is suppressed.

In addition, in the copper/ceramic bonded body according to one aspect of the present invention, it is preferable that at a bonded interface between the ceramic member and the copper member, an Ag—Cu alloy layer is formed on a side of the copper member, and a thickness t2 of the Ag—Cu alloy layer is set in a range of 1 μm or more and 15 μm or less.

In this case, since an Ag—Cu alloy layer is formed on the side of the copper member at a bonded interface between the ceramic member and the copper member, and a thickness t2 of the Ag—Cu alloy layer is set in a range of 1 μm or more and 15 μm or less, the Ag of the bonding material is sufficiently reacted with the copper member to bond the ceramic member to the copper member reliably and firmly, and concurrently, the hardening of the bonded interface is suppressed.

The insulating circuit substrate according to one aspect of the present invention is characterized being an insulating circuit substrate obtained by bonding a copper sheet consisting of copper or a copper alloy to a surface of a ceramic substrate, in which in an edge region of the copper sheet, an area ratio of an Ag solid solution part having an Ag concentration of 0.5% by mass or more and 15% by mass or less is set in a range of 0.03 or more and 0.35 or less.

It is noted thin the edge region of the copper sheet in the present invention is a region having a width of 100 μm from the edge of the copper sheet to the central side of the copper sheet, and a height in a range from the bonding surface of the ceramic substrate to a surface of the copper sheet on a side opposite to the ceramic substrate, in a cross section of the insulating circuit substrate along the laminating direction.

According to the insulating circuit substrate according to one aspect of the present invention, since an area ratio of an Ag solid solution part having an Ag concentration of 0.5% by mass or more and 15% by mass or less is set to 0.03 or more in an edge region of the copper sheet, Ag is sufficiently reacted at a bonded interface with respect to the ceramic substrate even in the edge of the copper sheet, which makes it possible to firmly bond the ceramic substrate to the copper sheet.

In addition, since the area ratio of the Ag solid solution part is set to 0.35 or less, the unnecessary hardening of the edge region of the copper sheet by the solid solution hardening is suppressed, which makes it possible to suppress the breaking or peeling of the ceramic substrate in a case where a thermal cycle is loaded.

Here, in the insulating circuit substrate according to one aspect of the present invention, it is preferable that at a bonded interface between the ceramic substrate and the copper sheet, an active metal compound layer is formed on a side of the ceramic substrate, and a thickness t1 of the active metal compound layer is set in a range of 0.05 μm or more and 0.8 μm or less.

In this case, since an active metal compound layer is formed on a side of the ceramic substrate at a bonded interface between the ceramic substrate and the copper sheet, and a thickness t1 of the active metal compound layer is set in a range of 0.05 μm or more and 0.8 μm or less, the activated metal reliably and firmly bonds the ceramic substrate and the copper sheet, and concurrently, the hardening of the bonded interface is suppressed.

In addition, in the insulating circuit substrate according to one aspect of the present invention, it is preferable that at a bonded interface between the ceramic substrate and the copper sheet, an Ag—Cu alloy layer is formed on a side of the copper sheet, and a thickness t2 of the Ag—Cu alloy layer is set in a range of 1 μm or more and 15 μm or less.

In this case, since an Ag—Cu alloy layer is formed on the side of the copper sheet at the bonded interface between the ceramic substrate and the copper sheet, and a thickness t2 of the Ag—Cu alloy layer is set in a range of 1 μm or more and 15 μm or less, the Ag of the bonding material is sufficiently reacted with the copper sheet to bond the ceramic substrate to the copper sheet reliably and firmly, and concurrently, the hardening of the bonded interface is suppressed.

Advantageous Effects of Invention

According to the present invention, it is possible to provide a copper/ceramic bonded body having an excellent thermal cycle reliability, which can suppress the occurrence of breaking in a ceramic member even in a case where a severe thermal cycle is loaded, and an insulating circuit substrate consisting of the copper/ceramic bonded body.

BRIEF DESCRIPTION OF DRAWINGS

FIG. 3 is an enlarged explanatory view of a circuit layer and a bonded interface between a metal layer and a ceramic substrate in the insulating circuit substrate according to the embodiment of the present invention.

DESCRIPTION OF EMBODIMENTS

Hereinafter, embodiments of the present invention will be described with reference to the accompanying drawings.

Figure 1:
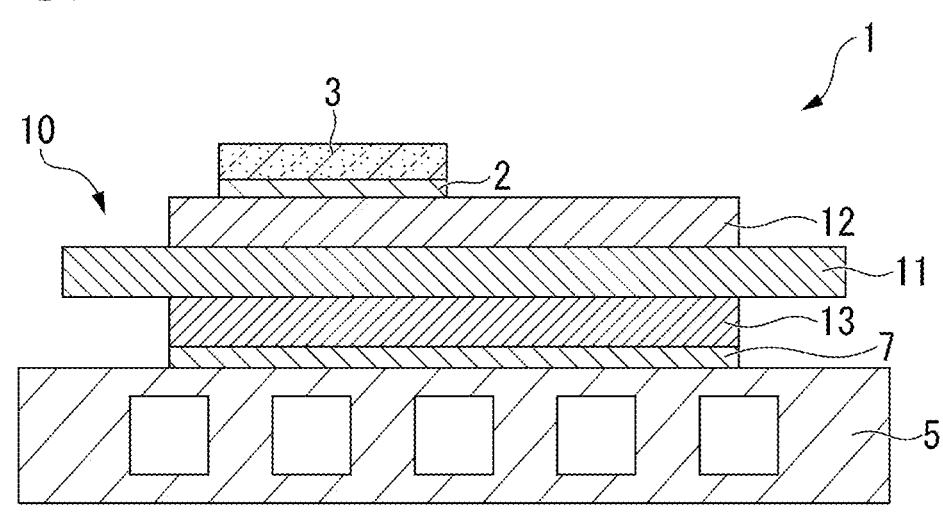
FIG. 1 is a schematic explanatory view of a power module using an insulating circuit substrate according to the embodiment of the present invention.

The copper/ceramic bonded body according to the present embodiment is an insulating circuit substrate 10 obtained by bonding a ceramic substrate 11 as a ceramic member consisting of ceramics, to a copper sheet 42 (a circuit layer 12) as a copper member consisting of copper or a copper alloy and a copper sheet 43 (a metal layer 13). FIG. 1 shows a power module 1 including an insulating circuit substrate 10 according to the present embodiment.

The power module 1 includes the insulating circuit substrate 10 on which each of the circuit layer 12 and the metal layer 13 is arranged; a semiconductor element 3 bonded to one surface (the upper surface in FIG. 1) of the circuit layer 12 by interposing a bonding layer 2; and a heat sink 5 disposed on the other side (the lower side in FIG. 1) of the metal layer 13.

The semiconductor element 3 is composed of a semiconductor material such as Si. The semiconductor element 3 and the circuit layer 12 are bonded with the bonding layer 2 being interposed therebetween.

The bonding layer 2 is composed of, for example, an Sn—Ag-based solder material, an Sn—In-based solder material, or an Sn—Ag—Cu-based solder material.

The heat sink 5 is a heat sink for dissipating heat from the insulating circuit substrate 10 described above. The heat sink 5 is composed of copper or a copper alloy, and in the present embodiment, it is composed of phosphorus deoxidized copper. The heat sink 5 includes a passage for allowing a cooling fluid to flow.

It is noted that in the present embodiment, the heat sink 5 is bonded to the metal layer 13 by a solder layer 7 which consists of a solder material. The solder layer 7 is composed of, for example, an Sn—Ag-based solder material, an Sn—In-based solder material, or an Sn—Ag—Cu-based solder material.

In addition, the insulating circuit substrate 10 which is the present embodiment includes, as shown in FIG. 1, the ceramic substrate 11, the circuit layer 12 arranged on one surface of the ceramic substrate 11 (the upper surface in FIG. 1), and the metal layer 13 arranged on the other surface of the ceramic substrate 11 (the lower surface in FIG. 1).

The ceramic substrate 11 is composed of ceramics such as silicon nitride ($Si_3N_4$), aluminum nitride (AlN), and alumina ($Al_2O_3$), which are excellent in terms of insulating properties and heat radiation. In the present embodiment, the ceramic substrate 11 is composed of aluminum nitride (AlN), which is excellent, particularly in terms of heat radiation. In addition, the thickness of the ceramic substrate 11 is set, for example, in a range of 0.2 mm or more and 1.5 mm or less, and the thickness thereof is set to 0.635 mm in the present embodiment.

Figure 5:
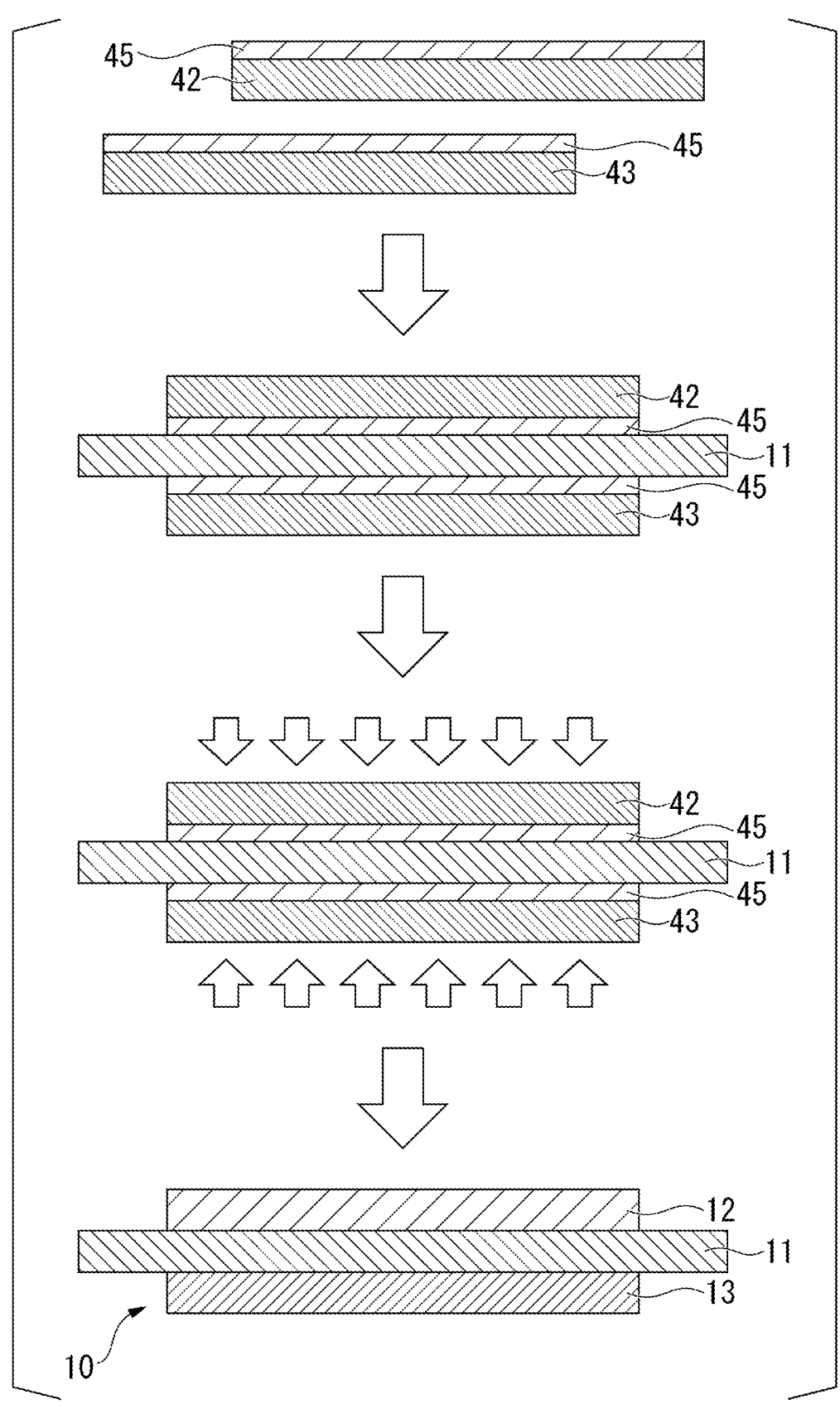
FIG. 5 is a schematic explanatory view of the manufacturing method for the insulating circuit substrate according to the embodiment of the present invention.

As shown in FIG. 5, the circuit layer 12 is formed by bonding the copper sheet 42 consisting of copper or a copper alloy to one surface (the upper surface in FIG. 5) of the ceramic substrate 11.

In the present embodiment, the circuit layer 12 is formed by bonding a rolled plate of oxygen-free copper to the ceramic substrate 11.

It is noted that the thickness of the copper sheet 42 which is to be the circuit layer 12 is set in a range of 0.1 mm or more and 2.0 mm or less, and the thickness is set to 0.6 mmn in the present embodiment.

As shown in FIG. 5, the metal layer 13 is formed by bonding the copper sheet 43 consisting of copper or a copper alloy to the other surface (the lower surface in FIG. 5) of the ceramic substrate 11.

In the present embodiment, the metal layer 13 is formed by bonding a rolled plate of oxygen-free copper to the ceramic substrate 11.

It is noted that the thickness of the copper sheet 43 which is to be the metal layer 13 is set in a range of 0.1 mm or more and 2.0 mm or less, and the thickness is set to 0.6 mm in the present embodiment.

Figure 2:
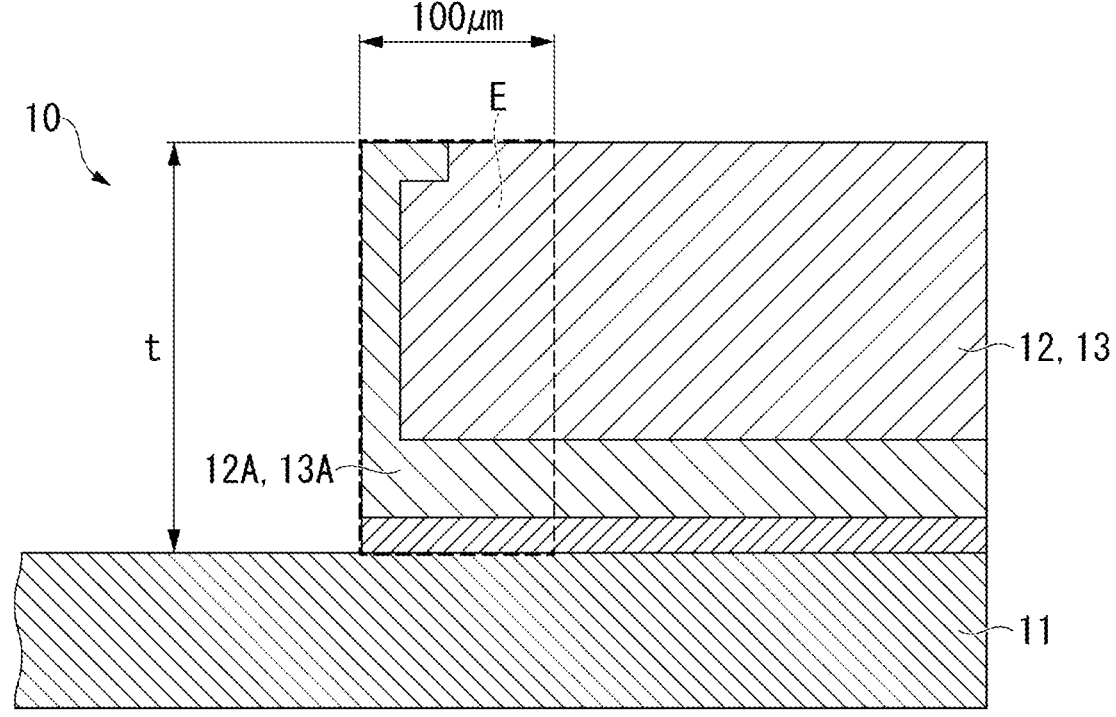
FIG. 2 is an enlarged explanatory view of a circuit layer and an edge of a metal layer in the insulating circuit substrate according to the embodiment of the present invention.

In addition, in the insulating circuit substrate 10 which is the present embodiment, at the bonded interface between the ceramic substrate 11 and each of the circuit layer 12 and the metal layer 13 as shown in FIG. 2, an area ratio of each of Ag solid solution parts 12A and 13A having an Ag concentration of 0.5% by mass or more and 15% by mass or less is set in a range of 0.03 or more and 0.35 or less in an edge region E (a region surrounded by the broken line) of each of the circuit layer 12 and metal layer 13. The Ag solid solution parts 12A and 13A are mainly formed, in the edge region E, in the vicinity of side surfaces (left and right end surfaces) of the circuit layer 12 and the metal layer 13 and at the bonded interface with respect to the ceramic substrate 11.

Here, the Ag solid solution parts 12A and 13A in the present embodiment are a region in which the Ag concentration is 0.5% by mass or more and 15% by mass or less in a case of subjecting the edges of the circuit layer 12 and the metal layer 13 to analysis with an electron probe microanalyzer (EPMA) and setting a total of Cu, and Ag and the active element which are contained in a bonding material 45 described later, to 100% by mass.

It is noted that as shown in FIG. 2, these Ag solid solution parts 12A and 13A may be each present at the bonded interface between the ceramic substrate 11 and each of the circuit layer 12 and the metal layer 13, at the end surface of each of the circuit layer 12 and the metal layer 13, or on the surface side of the edge of each of the circuit layer 12 and the metal layer 13.

In addition, the edge region E in the present embodiment is, as shown in FIG. 2, a region having a width of 100 μm from the edge of each of the circuit layer 12 and the metal layer 13 to the central part side of each of the circuit layer 12 and the metal layer 13, and a thickness t (a distance from the surface of the ceramic substrate 11 to the surface of each of the circuit layer 12 and the metal layer 13, which faces a side opposite to the ceramic substrate 11) of each of the circuit layer 12 and the metal layer 13, in the observation of the cross section of the ceramic substrate 11 along the laminating direction. It is noted that in a case where each of the Ag solid solution parts 12A and 13A is formed on the end surface of each of the circuit layer 12 and the metal layer 13, the width of the edge region E is a width of 100 μm to the central part side of each of the circuit layer 12 and the metal layer 13, where the edge of each of the Ag solid solution parts 12A and 13A serves as a starting point.

Figure 3:
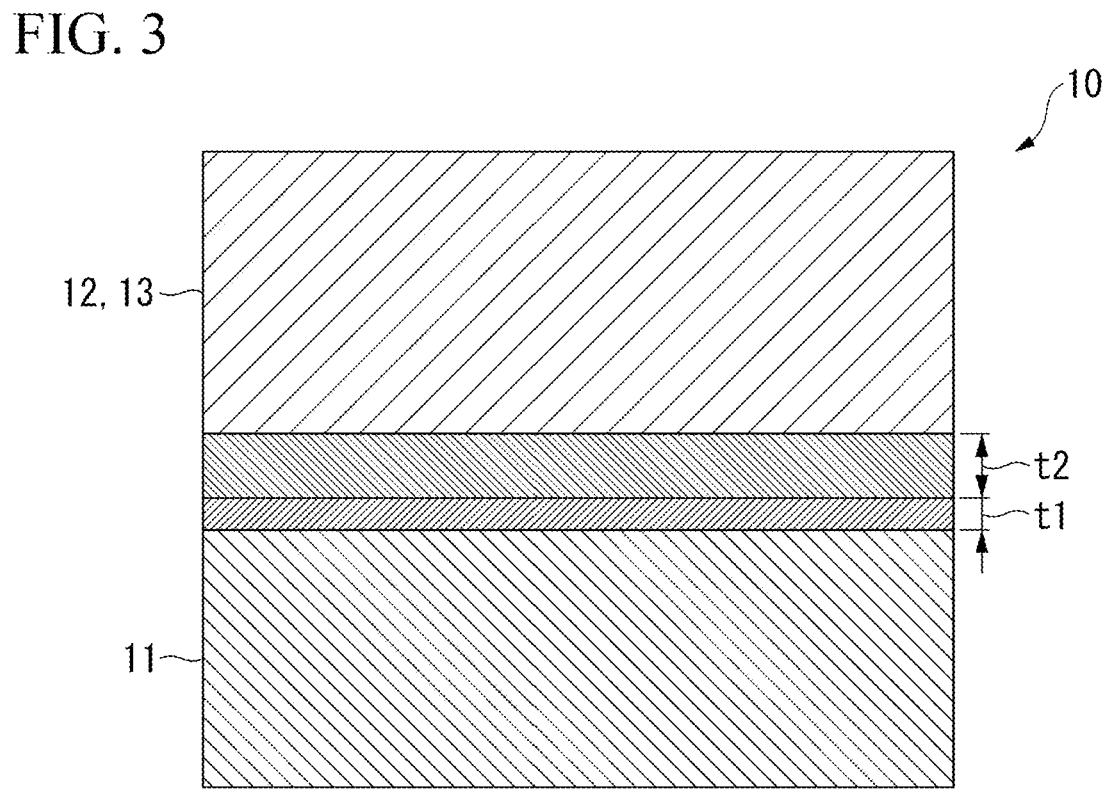

In addition, in the present embodiment, it is preferable that as shown in FIG. 3, an active metal compound layer 21 is formed at a bonded interface with respect to each of the circuit layer 12 and the metal layer 13, and a thickness t1 of this active metal compound layer 21 is set in a range of 0.05 μm or more and 0.8 μm or less.

Here, the active metal compound layer 21 is a layer consisting of a compound of the active metal (one or more selected from Ti, Zr, Nb, and Hf) that is used as the bonding material 45. More specifically, it is a layer consisting of a nitride of these active metals in a case where the ceramic substrate consists of silicon nitride ($Si_3N_4$) or aluminum nitride (AlN), and it is a layer consisting of an oxide of these active metals in a case where the ceramic substrate consists of alumina ($Al_2O_3$). The active metal compound layer 21 is formed by aggregating particles of an active metal compound. The average particle size of these particles is 10 nm or more and 100 nm or less.

It is noted that in the present embodiment, since a bonding material 45 contains Ti as an active metal and the ceramic substrate 11 is composed of aluminum nitride, the active metal compound layer 21 (21A and 21B) is composed of titanium nitride (TiN). That is, it is formed by aggregating titanium nitride (TiN) particles having an average particle size of 10 nm or more and 100 nm or less.

Further, in the present embodiment, it is preferable that at the bonded interface with respect to each of the circuit layer 12 and the metal layer 13, an Ag—Cu alloy layer 22 is formed, as shown in FIG. 3, on a side of the above-described active metal compound layer 21 on a side of each of the circuit layer 12 and the metal layer 13, and a thickness t2 of this Ag—Cu alloy layer 22 is set 1 μm or more and 15 μm or less.

It can be said that the active metal compound layer 21 is a part of the ceramic substrate (ceramic member) 11. It can also be said that the Ag—Cu alloy layer 22 is a part of each of the circuit layer (copper member) 12 and the metal layer (copper member) 13. For this reason, the bonded interface between the ceramic substrate 11 and each of the circuit layer 12 and the metal layer 13 (the copper sheets 42 and 43) is an interface between the active metal compound layer 21 and the Ag—Cu alloy layer 22. In a case where the Ag—Cu alloy layer 22 is not provided, the bonded interface between the ceramic substrate 11 and each of the circuit layer 12 and the metal layer 13 (the copper sheets 42 and 43) is an interface between the active metal compound layer 21 and each of the circuit layer 12 and the metal layer 13 (the copper sheets 42 and 43).

Figure 4:
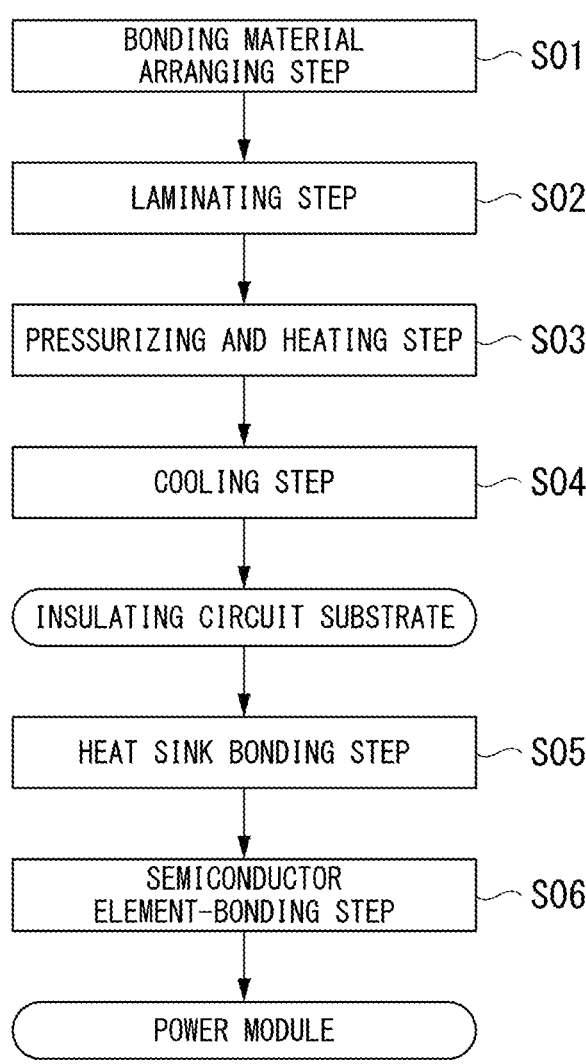
FIG. 4 is a flow chart of a manufacturing method for the insulating circuit substrate according to the embodiment of the present invention.

Hereinafter, a manufacturing method for the insulating circuit substrate 10 according to the present embodiment will be described with reference to FIG. 4 and FIG. 5.

(Bonding Material Arranging Step S01)

The copper sheet 42 which is to be the circuit layer 12 and the copper sheet 43 which is to be the metal layer 13 are prepared.

Then, the bonding material 45 is applied and dried on the bonding surface of the copper sheet 42 which is to be the circuit layer 12 and the bonding surface of the copper sheet 43 which is to be the metal layer 13. The coating thickness of the paste-like bonding material 45 is preferably set in a range of 10 μm or more and 50 μm or less after drying.

In the present embodiment, the paste-like bonding material 45 is applied by screen printing.

The bonding material 45 is a bonding material containing Ag and an active metal (one or more selected from Ti, Zr, Nb, or Hf). In the present embodiment, an Ag—Ti-based brazing material (an Ag—Cu—Ti-based brazing material) is used as the bonding material 45. As the Ag—Ti-based brazing material (the Ag—Cu—Ti-based brazing material), it is preferable to use, for example, a brazing material that contains Cu in a range of 0% by mass or more and 45% by mass or less contains Ti which is an active metal in a range of 0.5% by mass or more and 20% by mass or less, and has a balance of Ag and inevitable impurities.

Here, for the bonding material 45 to be applied, the film thickness in terms of Ag and the mass ratio Ag/active metal of Ag to the active metal are adjusted. This makes it possible to control the absolute amount and fluidity of an Ag—Cu liquid phase to be generated, in a pressurizing and heating step S03 described later.

Specifically, the film thickness in terms of Ag is preferably set to 2.5 μm or more and more preferably set to 3.5 μm or more. On the other hand, the film thickness in terms of Ag is preferably set to 10 μm or less and more preferably set to 8 μm or less.

In addition, the mass ratio Ag/active metal of Ag to the active metal is preferably set to 8 or more and more preferably set to 12 or more. On the other hand, the mass ratio Ag/active metal of Ag to the active metal is preferably set to 60 or less and more preferably set to 45 or less.

In addition, the specific surface area of the Ag powder contained in the bonding material 45 is preferably set to 0.15 $m^2/g$ or more, more preferably set to 0.25 $m^2/g$ or more, and still more preferably set to 0.40 $m^2/g$ or more. On the other hand, the specific surface area of the Ag powder contained in the bonding material 45 is preferably set to 1.40 $m^2/g$ or less, more preferably set to 1.00 $m^2/g$ or less, and still more preferably set to 0.75 $m^2/g$ or less.

Regarding the particle diameter of the Ag powder contained in the paste-like bonding material 45, it is preferable that D10 is in a range of 0.7 μm or more and 3.5 μm or less and D100 is 4.5 μm or more and 23 μm or less. In a particle size distribution measured according to a laser diffraction scattering type particle size distribution measuring method, D10 is a particle diameter at which the cumulative frequency is 10% on a volume basis, and D100 is a particle diameter at which the cumulative frequency is 100% on a volume basis.

(Laminating Step S02)

Next, the copper sheet 42 which is to be the circuit layer 12 is laminated on one surface (the upper surface in FIG. 5) of the ceramic substrate 11 by interposing the bonding material 45, and concurrently, the copper sheet 43 which is to be the metal layer 13 is laminated on the other surface (the lower surface in FIG. 5) of the ceramic substrate 11 by interposing the bonding material 45.

(Pressurizing and Heating Step S03)

Next, the copper sheet 42, the ceramic substrate 11, and the copper sheet 43 are heated in a pressurized state in a heating furnace in a vacuum atmosphere, and the bonding material 45 is melted.

Here, the heating temperature in the pressurizing and heating step S03 is preferably set in a range of 800° C. or higher and 850° C. or lower.

In addition, it is preferable that a product of a temperature integral value and a pressurization load in the temperature raising step from 780° C. to the heating temperature and the holding step at the heating temperature is set in a range of 0.3° C.·h·MPa or more and 40° C.·h·MPa or less. It is noted that the above-described temperature integral value is more preferably 0.6° C.·h·MPa or more and still preferably 1.0° C.·h·MPa or more. On the other hand, the above-described temperature integral value is more preferably 20° C.·h·MPa or less and still preferably 10° C.·h·MPa or less.

In addition, the pressurization load in the pressurizing and heating step S03 is preferably set in a range of 0.029 MPa or more and 0.98 MPa or less.

Further, the degree of vacuum in the pressurizing and heating step S03 is preferably set in a range of $1 \times 10^{-6}$ Pa or more and $5 \times 10^{-2}$ Pa or less.

(Cooling Step S04)

Then, after the pressurizing and heating step S03, cooling is carried out to solidify the molten bonding material 45, whereby the copper sheet 42 which is to be the circuit layer 12 is bonded to the ceramic substrate 11, and the ceramic substrate 11 is bonded to the copper sheet 43 which is to be the metal layer 13.

Here, in the present embodiment, it is preferable that a product R×P of a temperature decrease rate R (° C./min)

from the heating temperature to 780° C. and a pressurization load P (MPa) is set in a range of 0.15 (($° C./min)·MPa$) or more and 15 (($° C./min)·MPa$) or less.

It is noted that the above-described product R×P of the temperature decrease rate R ($° C./min$) from the heating temperature to 780° C. and the pressurizing load P (MPa) is preferably 0.5 (($° C./min)·MPa$) or more and still more preferably 0.75 (($° C./min)·MPa$) or more. On the other hand, the above-described product R×P of the temperature decrease rate R ($° C./min$) from the heating temperature to 780° C. and the pressurizing load P (MPa) is preferably 10 (($° C./min)·MPa$) or less and still more preferably 8 (($° C./min)·MPa$) or less.

In a case of adjusting the film thickness in terms of Ag and the mass ratio Ag/active metal of Ag to the active metal in a case of applying the bonding material 45, and concurrently defining, as described above, the temperature integral value in the pressurizing and heating step S03 and the product R×P of the temperature decrease rate R ($° C./min$) from the heating temperature to 780° C. and the pressurizing load P (MPa) in the cooling step S04, it is possible to control the fluid situation of the liquid phase, and it is possible to adjust the area ratio of each of the Ag solid solution parts 12A and 13A.

As described above, the insulating circuit substrate 10 which is the present embodiment is manufactured by the bonding material arranging step S01, the laminating step S02, the pressurizing and heating step S03, and the cooling step S04.

(Heat Sink Bonding Step S05)

Next, the heat sink 5 is bonded to the other surface side of the metal layer 13 of the insulating circuit substrate 10.

The insulating circuit substrate 10 and the heat sink 5 are laminated with a solder material being interposed therebetween and charged into a heating furnace, and the insulating circuit substrate 10 and the heat sink 5 are subjected to solder bonding with the solder layer 7 being interposed therebetween.

(Semiconductor Element-Bonding Step S06)

Next, the semiconductor element 3 is bonded by soldering to one surface of the circuit layer 12 of the insulating circuit substrate 10.

The power module 1 shown in FIG. 1 is produced by the above-described steps.

According to the insulating circuit substrate 10 (copper/ceramic bonded body) according to the present embodiment, which is configured as described above, since the area ratio of each of the Ag solid solution parts 12A and 13A having an Ag concentration of 0.5% by mass or more and 15% by mass or less is set to 0.03 or more in the edge region E of each of the circuit layer 12 and metal layer 13, Ag is sufficiently reacted at the bonded interface with respect to the ceramic substrate 11 even in the edge of each of the circuit layer 12 and the metal layer 13, which makes it possible to firmly bond the ceramic substrate 11 to the circuit layer 12 and the metal layer 13.

In addition, since the area ratio of each of the Ag solid solution parts 12A and 13A is set to 0.35 or less, the unnecessary hardening of the edge region E of each of the circuit layer 12 and the metal layer 13 by the solid solution hardening is suppressed, which makes it possible to suppress the breaking or peeling of the ceramic substrate 11 in a case where a thermal cycle is loaded. As a result, it is possible to sufficiently improve the thermal cycle reliability.

It is noted that in order to more firmly bond the ceramic substrate 11 to the circuit layer 12 and the metal layer 13, the area ratio of each of the Ag solid solution parts 12A and 13A is preferably set to 0.06 or more and more preferably set to 0.08 or more.

In addition, in order to further suppress the unnecessary hardening of the edge region of each of the circuit layer 12 and the metal layer 13 by the solid solution hardening, the area ratio of each of the Ag solid solution parts 12A and 13A is preferably set to 0.27 or less and more preferably set to 0.20 or less.

In addition, in the present embodiment, in a case where the active metal compound layer 21 is formed at the bonded interface between the ceramic substrate 11 and each of the circuit layer 12 and the metal layer 13, and the thickness t1 of the active metal compound layer 21 is set in a range of 0.05 μm or more and 0.8 μm or less, the activated metal reliably and firmly bonds the ceramic substrate 11 and each of the circuit layer 12 and the metal layer 13, and concurrently, the hardening of the bonded interface is suppressed.

It is noted that in order to further improve the thermal cycle reliability, the thickness t1 of the active metal compound layer 21 is preferably set to 0.08 μm or more and more preferably set to 0.15 μm or more.

In addition, in order to further suppress the unnecessary hardening of the bonded interface, the thickness t1 of the active metal compound layer 21 is preferably set to 0.5 μm or less and more preferably set to 0.35 μm or less.

Further, in the present embodiment, in a case where the Ag—Cu alloy layer 22 is formed at a bonded interface between the ceramic substrate 11 and each of the circuit layer 12 and the metal layer 13, and a thickness t2 of the Ag—Cu alloy layer 22 is set in a range of 1 μm or more and 15 μm or less, the Ag of the bonding material is sufficiently reacted with the circuit layer 12 and the metal layer 13 to bond the ceramic substrate 11 to the circuit layer 12 and the metal layer 13 reliably and firmly, and concurrently, the hardening of the bonded interface is suppressed.

It is noted that in order to more firmly bond the ceramic substrate 11 to the circuit layer 12 and the metal layer 13, the thickness t2 of the Ag—Cu alloy layer 22 is preferably set to 3 μm or more and more preferably set to 5 μm or more.

In addition, in order to further suppress the unnecessary hardening of the bonded interface, the thickness t2 of the Ag—Cu alloy layer 22 is preferably set to 13 μm or less and more preferably set to 11 μm or less.

The embodiments according to the present invention have been described as above; however, the present invention is not limited to this, and they can be appropriately changed without departing from the technical ideas of the present invention.

For example, the present embodiment has been described such that a semiconductor element is mounted on an insulating circuit substrate to constitute a power module; however, the present embodiment is not limited thereto. For example, an LED element may be mounted on a circuit layer of an insulating circuit substrate to constitute an LED module, or a thermoelectric element may be mounted on a circuit layer of an insulating circuit substrate to constitute a thermoelectric module.

In addition, in the insulating circuit substrate according to the present embodiment, the description has been made using, as an example, a ceramic substrate composed of aluminum nitride (AlN). However, the present invention is not limited thereto, and the insulating circuit substrate may be an insulating circuit substrate that uses another ceramic substrate such as alumina ($Al_2O_3$) or silicon nitride ($Si_3N_4$).

Further, in the present embodiment, the description has been made using Ti as an example of the active metal contained in the bonding material. However, the present embodiment is not limited thereto, and any one or two or more active metals selected from Ti, Zr, Hf, and Nb may be contained. It is noted that these active metals may be contained as hydrides.

Further, in the present embodiment, the description has been made such that the circuit layer is formed by bonding a rolled plate of oxygen-free copper to the ceramic substrate. However, the present invention is not limited thereto, and the circuit layer may be formed by being bonded to the ceramic substrate in a state where copper pieces obtained by punching a copper sheet are disposed in a circuit pattern. In this case, it suffices that each of the copper pieces has such an interface structure as described above between the copper piece and the ceramic substrate.

EXAMPLES

Hereinafter, a description will be given for the results of confirmatory experiments carried out to confirm the effectiveness of the present invention.

First, a ceramic substrate (40 mm×40 mm) shown in Table 1 was prepared. It is noted that the thickness was set to 0.635 mm for AlN and $Al_2O_3$ and was set to 0.32 mm for $Si_3N_4$.

In addition, as the copper sheet which was to be each of the circuit layer and the metal layer, a copper sheet consisting of oxygen-free copper and having a thickness of 37 mm×37 mm shown in Table 1 was prepared.

Then, the bonding material was applied on the copper sheet which was to be each of the circuit layer and the metal layer. It is noted that a paste material was used as the bonding material, and the amounts of Ag, Cu, and the active metal were set as shown in Table 1. Here, as shown in Table 1, the thickness in terms of Ag and the mass ratio Ag/active metal of Ag to the active metal were adjusted.

A copper sheet which is to be a circuit layer was laminated on one surface of the ceramic substrate. In addition, a copper sheet which is to be a metal layer was laminated on the other surface of the ceramic substrate.

This laminate was heated in a state of being pressurized in the lamination direction to generate an Ag—Cu liquid phase. In this case, the product of the temperature integral value and the pressurization load was set as shown in Table 2.

Then, the heated laminate was cooled to solidify the Ag—Cu liquid phase. In this case, the product of the temperature decrease rate from the heating temperature to 780° C. and the pressurization load was set as shown in Table 2.

By the above-described steps, the copper sheet which was to be the circuit layer, the ceramic substrate, and the metal plate which was to be the metal layer were bonded to each other, whereby an insulating circuit substrate (copper/ceramic bonded body) was obtained.

Regarding the obtained insulating circuit substrate (copper/ceramic bonded body), the area ratio of the Ag solid solution part in the edge region, the active metal compound layer, the Ag—Cu alloy layer, and the thermal cycle reliability were evaluated as follows.

(Area Ratio of Ag Solid Solution Part in Edge Region)

The cross section of each of the bonded interface between the circuit layer and the ceramic substrate and the bonded interface between the ceramic substrate and the metal layer was subjected to the EPMA analysis, a region in which the Ag concentration was in a range of 0.5% by mass or more and 15% by mass or less was defined as the Ag solid solution part in a case where a total of Ag+Cu+active metal was set to 100% by mass.

Then, the area ratio of the Ag solid solution part was calculated in the edge region of each of the circuit layer and the metal layer (here, the edge region is a region having a width of 100 μm from the edge of each of the circuit layer and the metal layer to the central part side of each of the circuit layer and the metal layer, and a thickness t of each of the circuit layer and the metal layer).

(Active Metal Compound Layer)

The cross section of each of the bonded interface between the circuit layer and the ceramic substrate and the bonded interface between the ceramic substrate and the metal layer was subjected to measurement at a magnification of 30,000 times using an electron scanning microscope (ULTRA55 manufactured by Carl Zeiss NTS, LLC, acceleration voltage: 1.8 kV), and an element map of N, O, and the active metal element was acquired according to the energy dispersive X-ray analysis method. It was determined that the active metal compound layer is present in a case where the active metal element and N or O are present in the same region.

The observation was carried out in both the five visual fields, a total of ten visual fields, and the average value obtained by dividing an area in a range in which the active metal element and N or O were present in the same region by the measured width was defined as the "thickness of the active metal compound layer", which is shown in Table 2.

(Ag—Cu Alloy Layer)

In the cross section of each of the bonded interface between the circuit layer and the ceramic substrate and the bonded interface between the ceramic substrate and the metal layer, an element map of each of Ag, Cu, and the active metal was acquired using an EPMA analyzer. Each element map was acquired in both the five visual fields.

Then, a region in which the Ag concentration was 15% by mass or more was defined as the Ag—Cu alloy layer in a case where Ag+Cu+active metal was set to 100% by mass, and an area thereof was determined to determine a value obtained by dividing the area by a width of the measurement region (area/width of measurement region). The average of the values is shown in Table 2 as the thickness of the Ag—Cu alloy layer.

(Thermal Cycle Reliability)

The above-described insulating circuit substrate was subjected to the following thermal cycle according to the material of the ceramic substrate to determine the presence or absence of ceramic breaking according to an SAT examination (ultrasonic examination). The evaluation results are shown in Table 2. The number of cycles leading to ceramic breaking occurrence in Table 2 means the number of thermal cycles required until the ceramic breaking occurs.

In case of AlN or $Al_2O_3$: The SAT examination is carried out every 50 cycles up to 500 cycles, where one cycle is defined as a load of −40° C.×10 min and 150° C.×10 min.

In case of $Si_3N_4$: The SAT examination is carried out every 200 cycles up to 2,000 cycles, where one cycle is defined as a load of −40° C.×10 min and 150° C.×10 min.

TABLE 1

| | | Ceramic substrate Material | Circuit layer Thickness mm | Metal layer Thickness mm | Bonding material | | | |
|---|---|---|---|---|---|---|---|---|
| | | | | | Cu mass % | Kind of active metal | Coating thickness in terms of Ag μm | Mass ratio Ag/active metal |
| Present Invention Example | 1 | AlN | 0.35 | 0.35 | — | Zr | 9.8 | 59.8 |
| | 2 | AlN | 0.35 | 0.35 | — | Ti | 4.2 | 10.9 |
| | 3 | AlN | 0.35 | 0.35 | 27.5 | Hf | 5.5 | 12.4 |
| | 4 | $Si_3N_4$ | 0.8 | 0.8 | 35.5 | Hf | 2.5 | 8.1 |
| | 5 | $Si_3N_4$ | 0.8 | 0.8 | — | Zr | 3.4 | 45.4 |
| | 6 | $Si_3N_4$ | 0.8 | 0.8 | — | Ti | 7.8 | 27.5 |
| | 7 | $Al_2O_3$ | 0.4 | 0.4 | — | Ti | 9.4 | 49.3 |
| | 8 | $Al_2O_3$ | 0.4 | 0.4 | 24.5 | Nb | 7.0 | 43.8 |
| Comparative Example | 1 | AlN | 0.35 | 0.35 | — | Zr | 3.0 | 13.2 |
| | 2 | AlN | 0.35 | 0.35 | 4.0 | Ti | 9.5 | 60.0 |
| | 3 | $Si_3N_4$ | 0.8 | 0.8 | 3.0 | Ti | 4.4 | 22.4 |
| | 4 | $Si_3N_4$ | 0.8 | 0.8 | — | Ti | 7.2 | 38.5 |
| | 5 | $Al_2O_3$ | 0.4 | 0.4 | 3.0 | Hf | 3.2 | 26.8 |
| | 6 | $Al_2O_3$ | 0.4 | 0.4 | — | Zr | 8.6 | 53.6 |

TABLE 2

| | | Pressurizing and heating step Product of temperature integral value and pressurization load (° C. · h) MPa | Cooling step Product of temperature decrease rate and pressurization load (° C./min) MPa | Edge of copper sheet Area ratio of Ag solid solution part | Active metal compound layer Thickness t1 (μm) | Ag—Cu alloy layer Thickness t2 (μm) | Thermal cycle reliability Breaking occurrence (number of cycles) |
|---|---|---|---|---|---|---|---|
| Present Invention Example | 1 | 39.65 | 14.83 | 0.346 | 0.23 | 13 | 300th |
| | 2 | 0.63 | 0.53 | 0.063 | 0.79 | 5 | 350th |
| | 3 | 1.16 | 0.75 | 0.086 | 0.30 | 7 | 400th |
| | 4 | 0.32 | 0.15 | 0.031 | 0.08 | 1 | 1600th |
| | 5 | 12.19 | 10.26 | 0.211 | 0.05 | 3 | 1800th |
| | 6 | 6.01 | 3.43 | 0.125 | 0.47 | 11 | >2000th |
| | 7 | 19.44 | 13.44 | 0.266 | 0.35 | 15 | 350th |
| | 8 | 9.78 | 6.25 | 0.185 | 0.15 | 9 | 400th |
| Comparative Example | 1 | 0.32 | 0.12 | 0.023 | 0.18 | 5 | 50th |
| | 2 | 45.24 | 3.79 | 0.423 | 0.33 | 13 | 50th |
| | 3 | 0.15 | 0.09 | 0.013 | 0.12 | 7 | 600th |
| | 4 | 2.51 | 17.45 | 0.400 | 0.28 | 10 | 1200th |
| | 5 | 0.15 | 0.18 | 0.025 | 0.04 | 5 | 50th |
| | 6 | 9.78 | 15.90 | 0.370 | 0.21 | 12 | 50th |

First, Present Invention Examples 1 to 3 and Comparative Examples 1 and 2, in which AlN has been used as a ceramic substrate, are compared.

In Comparative Example 1, the area ratio of the Ag solid solution part in the edge region of the circuit layer (metal layer) was set to 0.023, and the number of cycles leading to breaking occurrence was 50 cycles in the thermal cycle test.

In Comparative Example 2, the area ratio of the Ag solid solution part in the edge region of the circuit layer (metal layer) was set to 0.423, and the number of cycles leading to breaking occurrence was 50 cycles in the thermal cycle test.

On the other hand, in Present Invention Example 1, the area ratio of the Ag solid solution part in the edge region of the circuit layer (metal layer) was set to 0.346, and the number of cycles leading to breaking occurrence was 300 cycles in the thermal cycle test.

In Present Invention Example 2, the area ratio of the Ag solid solution part in the edge region of the circuit layer (metal layer) was set to 0.063, and the number of cycles leading to breaking occurrence was 350 cycles in the thermal cycle test.

In Present Invention Example 3, the area ratio of the Ag solid solution part in the edge region of the circuit layer (metal layer) was set to 0.086, and the number of cycles leading to breaking occurrence was 400 cycles in the thermal cycle test.

As described above, Present Invention Examples 1 to 3 were excellent in thermal cycle reliability compared with Comparative Examples 1 and 2.

Next, Present Invention Examples 4 to 6 and Comparative Examples 3 and 4, in which $Si_3N_4$ has been used as a ceramic substrate, are compared.

In Comparative Example 3, the area ratio of the Ag solid solution part in the edge region of the circuit layer (metal layer) was set to 0.013, and the number of cycles leading to breaking occurrence was 600 cycles in the thermal cycle test.

In Comparative Example 4, the area ratio of the Ag solid solution part in the edge region of the circuit layer (metal layer) was set to 0.400, and the number of cycles leading to breaking occurrence was 1,200 cycles in the thermal cycle test.

On the other hand, in Present Invention Example 4, the area ratio of the Ag solid solution part in the edge region of the circuit layer (metal layer) was set to 0.031, and the number of cycles leading to breaking occurrence was 1,600 cycles in the thermal cycle test.

In Present Invention Example 5, the area ratio of the Ag solid solution part in the edge region of the circuit layer (metal layer) was set to 0.211, and the number of cycles leading to breaking occurrence was 1,800 cycles in the thermal cycle test.

In Present Invention Example 6, the area ratio of the Ag solid solution part in the edge region of the circuit layer (metal layer) was set to 0.125, and no breaking occurred even after 2,000 cycles in the thermal cycle test.

As described above, Present Inventive Examples 4 to 6 were excellent in thermal cycle reliability compared with Comparative Examples 3 and 4.

Next, Present Invention Examples 7 and 8 and Comparative Examples 5 and 6, in which $Al_2O_3$ has been used as a ceramic substrate, are compared.

In Comparative Example 5, the area ratio of the Ag solid solution part in the edge region of the circuit layer (metal layer) was set to 0.025, and the number of cycles leading to breaking occurrence was 50 cycles in the thermal cycle test.

In Comparative Example 6, the area ratio of the Ag solid solution part in the edge region of the circuit layer (metal layer) was set to 0.370, and the number of cycles leading to breaking occurrence was 50 cycles in the thermal cycle test.

On the other hand, in Present Invention Example 7, the area ratio of the Ag solid solution part in the edge region of the circuit layer (metal layer) was set to 0.266, and the number of cycles leading to breaking occurrence was 350 cycles in the thermal cycle test.

In Present Invention Example 8, the area ratio of the Ag solid solution part in the edge region of the circuit layer (metal layer) was set to 0.185, and the number of cycles leading to breaking occurrence was 400 cycles in the thermal cycle test. As described above, Present Inventive Examples 7 and 8 were excellent in thermal cycle reliability compared with Comparative Examples 5 and 6.

From the results of the above-described confirmatory experiments, according to Present Invention Examples, it has been confirmed that it is possible to provide an insulating circuit substrate (a copper/ceramic bonded body) having an excellent thermal cycle reliability, which can suppress the occurrence of breaking in a ceramic substrate even in a case where a severe thermal cycle is loaded.

INDUSTRIAL APPLICABILITY

According to the present invention, it is possible to provide a copper/ceramic bonded body having an excellent thermal cycle reliability, which can suppress the occurrence of breaking in a ceramic member even in a case where a severe thermal cycle is loaded, and an insulating circuit substrate consisting of the copper/ceramic bonded body.

REFERENCE SIGNS LIST

10: Insulating circuit substrate (copper/ceramic bonded body)
11: Ceramic substrate (ceramic member)
12: Circuit layer (copper member)
13: Metal layer (copper member)
12A, 13A: Ag solid solution part
21: Active metal compound layer
22: Ag—Cu alloy layer

The invention claimed is:

1. A copper/ceramic bonded body obtained by bonding a copper member consisting of copper or a copper alloy to a ceramic member,
   wherein in an edge region of the copper member, an area ratio of an Ag solid solution part having an Ag concentration of 0.5% by mass or more and 15% by mass or less is set in a range of 0.03 or more and 0.35 or less.

2. The copper/ceramic bonded body according to claim 1,
   wherein at a bonded interface between the ceramic member and the copper member, an active metal compound layer is formed on a side of the ceramic member, and
   a thickness t1 of the active metal compound layer is set in a range of 0.05 μm or more and 0.8 μm or less.

3. The copper/ceramic bonded body according to claim 1,
   wherein at a bonded interface between the ceramic member and the copper member, an Ag—Cu alloy layer is formed on a side of the copper member, and
   a thickness t2 of the Ag—Cu alloy layer is set in a range of 1 μm or more and 15 μm or less.

4. An insulating circuit substrate obtained by bonding a copper sheet consisting of copper or a copper alloy to a surface of a ceramic substrate,
   wherein in an edge region of the copper sheet, an area ratio of an Ag solid solution part having an Ag concentration of 0.5% by mass or more and 15% by mass or less is set in a range of 0.03 or more and 0.35 or less.

5. The insulating circuit substrate according to claim 4,
   wherein at a bonded interface between the ceramic substrate and the copper sheet, an active metal compound layer is formed on a side of the ceramic substrate, and
   a thickness t1 of the active metal compound layer is set in a range of 0.05 μm or more and 0.8 μm or less.

6. The insulating circuit substrate according to claim 4,
   wherein at a bonded interface between the ceramic substrate and the copper sheet, an Ag—Cu alloy layer is formed on a side of the copper sheet, and
   a thickness t2 of the Ag—Cu alloy layer is set in a range of 1 μm or more and 15 μm or less.

* * * * *